(12) United States Patent
Heng

(10) Patent No.: US 8,744,386 B2
(45) Date of Patent: Jun. 3, 2014

(54) METHOD OF TUNING RECEIVER HAVING TUNABLE AMPLIFIER WITH INTEGRATED TRACKING FILTER

(75) Inventor: Chee-Lee Heng, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 1113 days.

(21) Appl. No.: 12/726,330

(22) Filed: Mar. 17, 2010

(65) Prior Publication Data
US 2010/0190458 A1 Jul. 29, 2010

Related U.S. Application Data

(62) Division of application No. 11/623,309, filed on Jan. 15, 2007, now Pat. No. 7,715,813.

(51) Int. Cl.
H04B 1/18 (2006.01)
(52) U.S. Cl.
USPC ....... 455/150.1; 455/87; 455/191.3; 455/340; 455/341
(58) Field of Classification Search
USPC ............. 455/150.1, 87, 191.3, 341, 190.1, 455/191.1, 192.1, 194.2, 195.1, 189.1, 263, 455/307, 339–340; 327/553–554; 330/263, 330/265, 267, 296, 310–311; 348/731, 733
See application file for complete search history.

(56) References Cited

U.S. PATENT DOCUMENTS

| 6,236,281 | B1 * | 5/2001 | Nguyen et al. ........... 331/154 |
| 6,285,865 | B1 | 9/2001 | Vorenkamp |
| 6,750,734 | B2 | 6/2004 | Utsunomiya |
| 6,771,124 | B1 | 8/2004 | Ezell |
| 6,882,245 | B2 | 4/2005 | Utsunomiya |
| 6,897,729 | B1 | 5/2005 | Jin |
| 6,940,365 | B2 | 9/2005 | Kamata |
| 7,127,217 | B2 | 10/2006 | Tuttle |
| 7,251,466 | B2 * | 7/2007 | Porret et al. ........... 455/190.1 |
| 7,259,643 | B2 | 8/2007 | Son |
| 7,266,351 | B2 | 9/2007 | Marholev |
| 7,400,212 | B1 | 7/2008 | Vishinsky |
| 7,512,390 | B2 | 3/2009 | Lee |
| 7,512,391 | B2 | 3/2009 | Lester |
| 8,253,514 | B2 * | 8/2012 | Kharrat et al. ........... 333/197 |
| 8,422,977 | B2 * | 4/2013 | Robert ................... 455/323 |
| 8,611,843 | B2 * | 12/2013 | Vogas ................... 455/286 |

(Continued)

FOREIGN PATENT DOCUMENTS

| TW | 200303122 | 8/2003 |
| TW | I261422 | 9/2006 |
| TW | 200640157 | 11/2006 |
| TW | 200644629 | 12/2006 |

Primary Examiner — Pablo Tran
(74) Attorney, Agent, or Firm — Winston Hsu; Scott Margo

(57) ABSTRACT

A method of tuning a receiver includes: providing a tunable Low Noise Amplifier (LNA) having a plurality of LNAs and a plurality of LC loads coupled to the plurality of LNAs; selecting a desired LNA and a LC load corresponding to the desired LNA; isolating the desired LNA from the selected LC load; generating a local oscillation (LO) signal; routing the LO signal to the output of the tunable LNA to generate a filtered LO signal; determining a first signal power level of the filtered LO signal; changing the capacitance in the selected LC load and determining a second signal power level of the filtered LO signal; comparing the first filtered signal power level to the second filtered signal power level; and according to the comparison result, determining whether or not to adjust the capacitance in the selected LC load.

13 Claims, 4 Drawing Sheets

(56) References Cited

U.S. PATENT DOCUMENTS

| | | |
|---|---|---|
| 2005/0088254 A1 | 4/2005 | Belk |
| 2005/0190013 A1 | 9/2005 | Utsunomiya |
| 2006/0028301 A1 | 2/2006 | Kamata |
| 2006/0154636 A1 | 7/2006 | Shah |
| 2010/0085490 A1* | 4/2010 | Chen .......................... 348/725 |

* cited by examiner

METHOD OF TUNING RECEIVER HAVING TUNABLE AMPLIFIER WITH INTEGRATED TRACKING FILTER

CROSS REFERENCE TO RELATED APPLICATIONS

This divisional application claims the benefit of co-pending U.S. patent application Ser. No. 11/623,309, filed on Jan. 15, 2007 and incorporated herein by reference.

BACKGROUND

The present invention relates to the tuning of integrated LC filters, and more particularly to the tuning of integrated LC filters in broadband television receivers.

Modern receiver systems utilize broadband technology to receive a wide range of frequencies. In order to prevent in-band blockers from interfering with the receiver operation, a receiver requires very high linearity at its front end. In broadband television receivers, a conventional method of achieving high linearity in the presence of in-band blockers is to utilize Automatic Gain Control (AGC). A desired signal together with the in-band blocker are applied to a conventional receiver and amplified utilizing a broadband Low Noise Amplifier (LNA) and a Variable Gain Amplifier (VGA). A Wide Band Power Detector, coupled to the output of the VGA, converts the desired signal and blocker power to a DC voltage, which is then input to the base-band part of the receiver. As the DC voltage is directly proportional to the input signal power, the base-band is able to detect the presence of strong blocker(s) if the corresponding base-band Radio Signal Strength Indicator (RSSI) level is not proportional to the WBPD DC level. When this occurs, the base-band will send a signal to the front end to decrease the gain of the VGA. As the gain decreases, however, the receiver noise figure will also increase. Therefore, the use of AGC is limited.

Many receivers therefore utilize tracking filters to amplify only the desired input signal, thus reducing the need for such high linearity. In a direct conversion receiver the tracking filter can track the internal Local Oscillation (LO) signal generated by a phase locked loop (PLL). The frequency response of a filter refers to the characteristic(s) of the filter that conditions the input/internal signal to the filter. The filter will show frequency responses based on certain circuit parameters.

In a broadband receiver, a filter is required that has many frequency responses, i.e. a tunable filter. Prior art receivers utilize radio frequency (RF) tracking filters, which are equivalent to band-pass filters. U.S. Pat. No. 6,285,865, which is included here for reference, discloses a receiver with such a tunable filter. The disclosed integrated chip comprises: a first adjustable on-chip filter having a first plurality of selectable capacitors that determine its center frequency; a second adjustable on-chip filter having a second plurality of selectable capacitors that determine its center frequency; means for selecting a number of the first plurality of capacitors to adjust the first filter to a desired center frequency; and means for transferring the selection of the first plurality of capacitors to the second plurality of capacitors to adjust the second filter to a center frequency proportional to the desired frequency. The receiver described needs to calibrate a dummy tunable filter first before transferring the results from the dummy filter to the other tunable filter in the main signal path. The need to duplicate and tune another tunable filter is partly due to the fact the tuning of the filter in the main signal path will be affected by interferences coming from the antenna. This causes the die area to increase unnecessarily.

Recently, other receivers incorporating integrated tracking filters have been developed. U.S. Pat. No. 7,127,217 is included as an illustration, and shown in FIG. 4. In this prior art, the entire receiving path including the down-mixers must be configured to receive the filtered signal from the tunable filter. In addition, the calibration signal will radiate through the antenna if an additional antenna switch is not present.

In both prior arts, the calibration of these tunable filters must either be done in the factory to prevent radiation through the antenna, or outside the signal path. A receiver comprising an integrated tracking filter that minimizes interference to the receiver and prevents the radiation of calibration signal into the air during the filter calibration process is needed. If the entire receiver path is not required during the tuning process, receiver power consumption may be reduced even further.

SUMMARY

It is therefore an objective of the present invention to introduce a method of tuning a receiver having an integrated tracking filter.

According to one aspect of the present invention, an exemplary method includes the following steps: providing a tunable Low Noise Amplifier (LNA) having a plurality of LNAs and a plurality of LC loads coupled to the plurality of LNAs; selecting a desired LNA and a LC load corresponding to the desired LNA; isolating the desired LNA from the selected LC load; generating a local oscillation (LO) signal; routing the LO signal to the selected LC load; determining a first filtered signal power level of the LO signal with the WBPD; changing the capacitance in the selected LC load; determining a second filtered signal power level of the LO signal; comparing the first filtered signal power level to the second filtered signal power level; and according to the comparison result, determining whether to adjust the capacitance in the selected LC load.

According to another aspect of the present invention, an exemplary method includes the following steps: providing a tunable Low Noise Amplifier (LNA) having an LNA and a filter selected during a calibration mode, wherein an input signal of the tunable LNA is passed to the selected filter through the selected LNA during a normal mode; and during the calibration mode, generating a local oscillation (LO) signal, generating a filter LO signal by routing the LO signal to the selected filter, and tuning the selected filter according to the filter LO signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The disclosed receiver utilizes an integrated filter for tracking to an LO signal, wherein the filter includes a plurality of LC banks integrated in a Low Noise Amplifier (LNA). The filter works by tuning the LC banks to the LO signal in a calibration mode.

Figure 1:
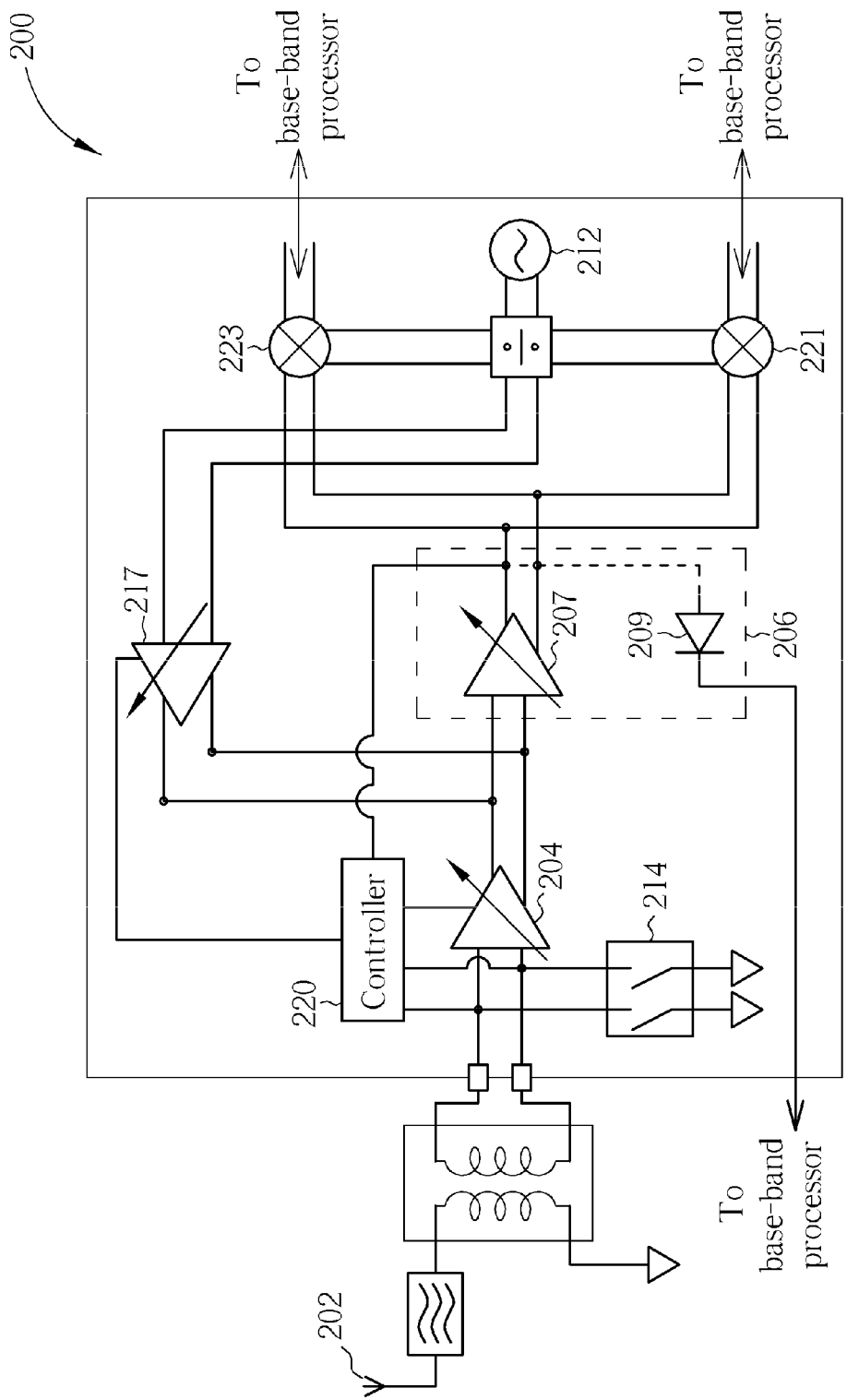
FIG. 1 is a diagram of an exemplary embodiment of a receiver comprising an integrated tracking filter.

Please refer to FIG. 1. FIG. 1 is a diagram of an exemplary embodiment of the disclosed receiver 200. In this embodiment the receiver is a digital direct conversion receiver, however, the disclosed invention and method are also applicable to other receivers. The receiver 200 comprises an antenna 202 coupled to a tunable Low Noise Amplifier (LNA) 204. The output of the tunable LNA 204 is coupled to a power detecting circuit 206, comprising a Variable Gain Amplifier (VGA) 207 coupled to a Wide Band Power Detector (WBPD) 209. The output of the VGA 207 is also coupled to a plurality of down mixers 221, 223, which down convert received signals to base-band signals. A phase locked loop (PLL) 212 in the receiver 200 is coupled to buffer 217, which is in turn coupled to the output of the tunable LNA 204. A first switch unit 214 is coupled to the input of the tunable LNA 204. A controller 220 is coupled to the first switch unit 214, the tunable LNA 204, and the power detecting circuit 206.

Figure 2:
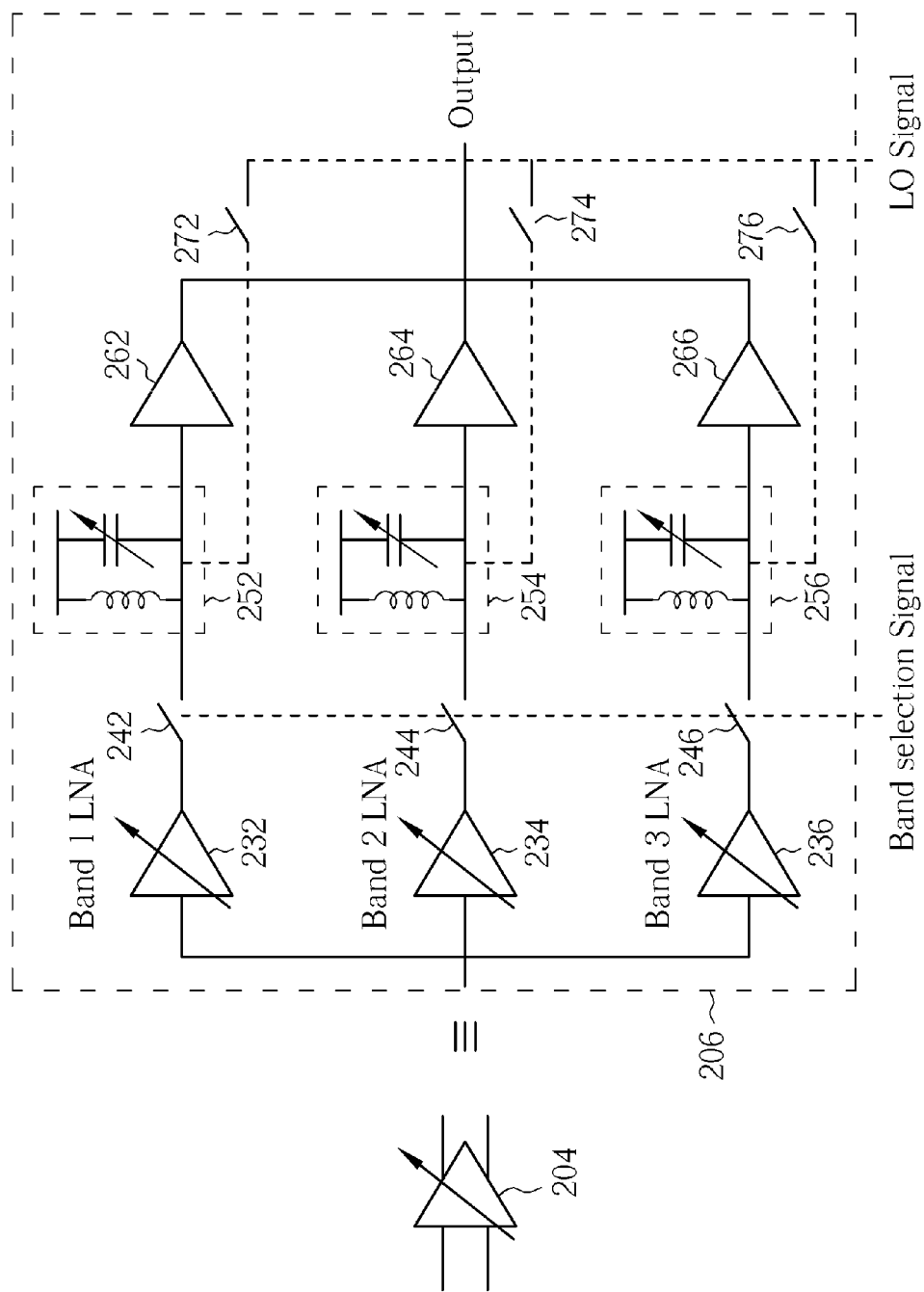
FIG. 2 is a diagram of the integrated tracking filter

The tunable LNA 204 in FIG. 1 is made tunable by integrating a plurality of LC loads into the amplifier. Please refer to FIG. 2. FIG. 2 is a diagram of the tunable LNA 204. The tunable LNA 204 includes a plurality of band LNAs 232, 234, 236 coupled to a plurality of first switches 242, 244, 246 respectively. The plurality of first switches 242, 244, 246 is further coupled to LC loads 252, 254, 256 comprising the integrated filter. Each LC load 252, 254, 256 is coupled to a buffer 262, 264, 266 respectively, and coupled to the LO signal by means of a plurality of second switches 272, 274, 276.

During calibration mode, an LNA (e.g. 232) is selected from the plurality of LNAs 232, 234, 236 and a corresponding LC load (e.g. 252) is selected from the plurality of LC loads 252, 254, 256 according to the frequency of the desired signal.

Next, an LO signal is generated according to the frequency of the desired signal and routed to the tunable LNA 204 by the buffer 217. The first switch unit 214 is for shorting the tunable LNA 204 input during tuning. The controller 220 controls the first switch unit 214 to open or close and the buffer 217 to turn on or off. The LNAs 232, 234, 236, down-mixers 221, 223 and the base-band circuits coupled to the output of these down-mixers are turned off during this mode. In addition, the buffer (e.g. 262) corresponding to the selected LNA is turned-on. The other buffers 264, 266 will be turned off.

All the first switches 242, 244, 246 are opened during calibration. This further has the function of isolating the LC load from the antenna 202. The operation of the plurality of second switches is controlled by the controller 220. The LO signal will then be passed to one of the selected LC loads 252, 254, 256 and the filtered LO signal power level measured with the WBPD. Then capacitance of the LC load is changed, and the filtered LO signal power level measured again. If the second filtered signal power level is higher than the first filtered signal power level, the capacitance in the LC load has been changed correctly and the filter is being tuned in the correct direction. This process will continue until the filter is centered.

During normal operation, the selected LNA (e.g. 232), the corresponding first switch (e.g. 242) is closed to couple the selected LNA to the tuned LC load (e.g. 252), the corresponding buffer (e.g. 262) is turned on and the first switch unit 214 is open, enabling input signals to be passed to the tunable LNA 204.

In one embodiment, during the calibration mode, all capacitances in the selected LC load are switched in. The filtered LO signal is passed through the VGA 207 and the signal power then determined by the WBPD 209. A unit capacitance is then removed from the LC load, and the signal power of the filtered LO signal determined again. If the first signal power level is lower than the second signal power level then the calibrating procedure must be repeated once more, by removing more unit capacitances from the selected LC load. Once the filter is centered then the tuning phase can be exited.

Figure 3:
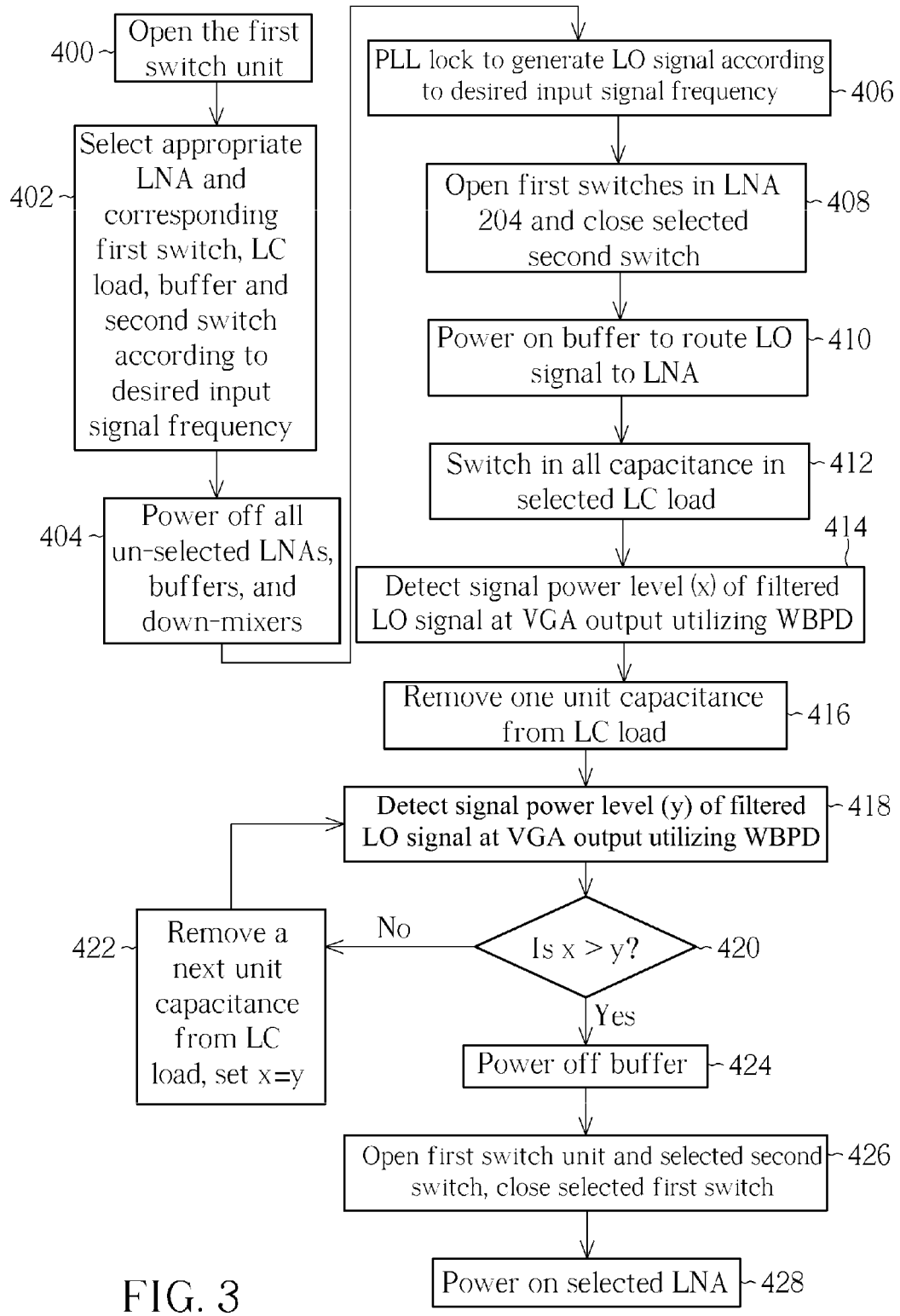
FIG. 3 is a flowchart detailing the tuning method of the receiver in FIG. 1.
Figure 4:
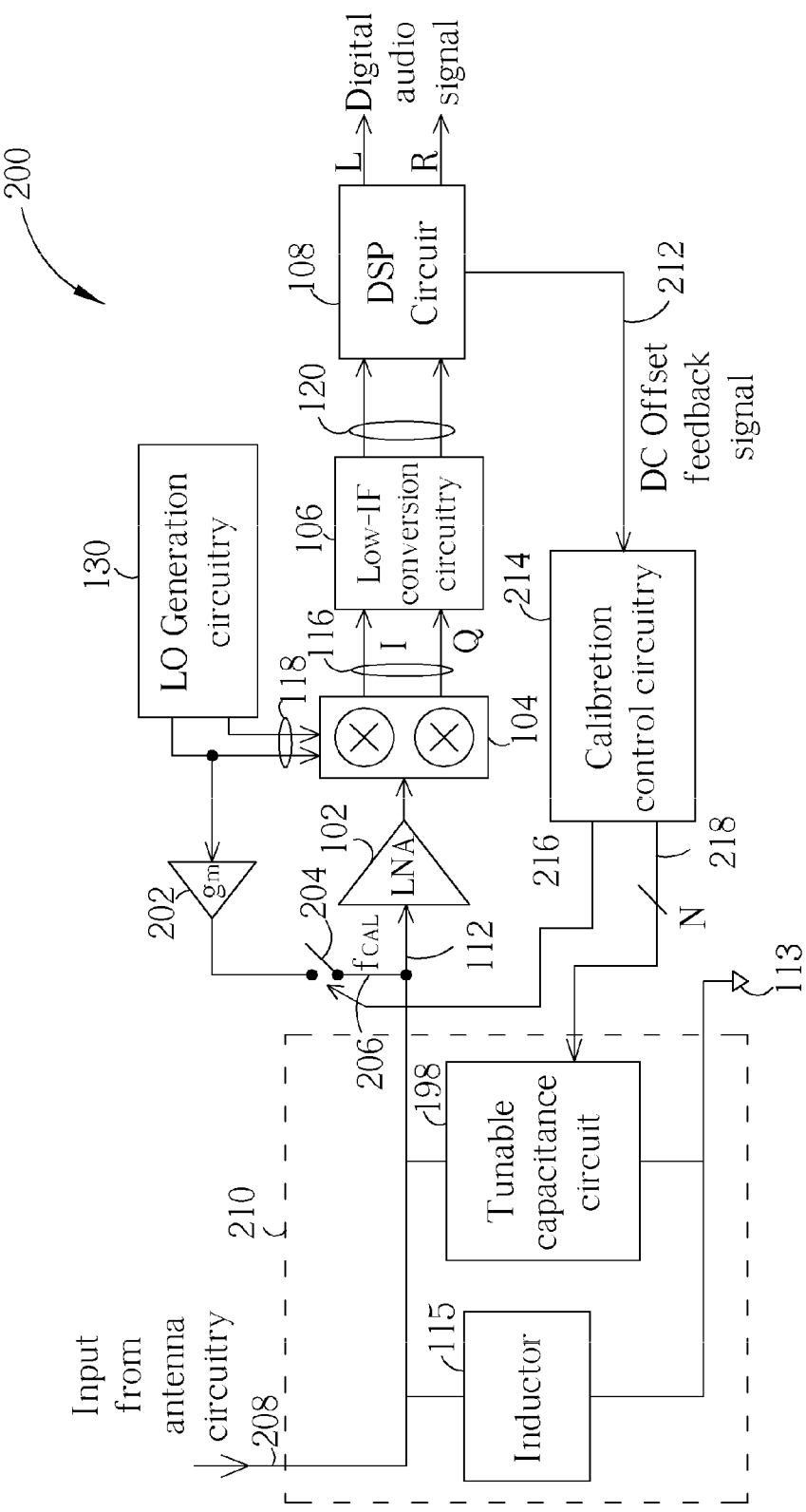
FIG. 4 is a diagram of a conventional receiver.

Please refer to FIG. 3. FIG. 3 is a flowchart detailing an exemplary embodiment of the calibration mode of the disclosed receiver. The steps are as follows:

Step 400: Open the first switch unit 214;

Step 402: Select an appropriate LNA from the plurality of LNAs 232, 234, 236 (e.g. 232) along with a corresponding first switch from the plurality of first switches 242, 244, 246 (e.g. 242), a LC load from the plurality of LC loads 252, 254, 256 (e.g. 252), a buffer from the plurality of buffers 262, 264, 266 (e.g. 262) and a second switch from the plurality of second switches 272, 274, 276 (e.g. 272) according to desired input signal frequency;

Step 404: Power off all un-selected LNAs (234, 236), buffers (264, 266) and down-mixers 221, 223;

Step 406: PLL 212 lock to generate LO signal according to desired input signal frequency;

Step 408: Open first switches 242, 244, 246 in LNA 204 and close selected second switch (e.g. 272);

Step 410: Power on buffer 217 to route LO signal to LNA 204;

Step 412: Switch in all capacitance in selected LC load (e.g. 252);

Step 414: Detect signal power level (x) of filtered LO signal at VGA 207 output utilizing WBPD 209;

Step 416: Remove one unit capacitance from LC load (e.g. 252);

Step 418: Detect signal power level (y) of filtered LO signal at VGA 207 output utilizing WBPD 209;

Step 420: Is x>y? If yes go to Step 424, if no go to Step 422;

Step 422: Remove a next unit capacitance from LC load (e.g. 252), set x=y and go back to Step 418;

Step 424: Power off buffer 217;

Step 426: Open first switch unit 214 and selected second switch 272, close selected first switch (e.g. 242);

Step 428: Power on selected LNA (e.g. 232).

Please note that the above method is for a single pole LC, however, the disclosed method and apparatus can also be applied to a tracking filter having more than two LC poles. In this case, steps 418~422 will be repeated for each pole until all poles are centered, and the method will then proceed to step 424. Both embodiments fall within the scope of the present invention.

By implementing the tracking filter after the tunable LNA 204, the tracking filter can be isolated from front-end interference and the calibration signal (LO signal) will not radiate into the air via the antenna 202. Implementation of first switches 242, 244, 246 in the tracking filter, and the first switch unit 214 at the tunable LNA 204 input further ensure these benefits. Furthermore, by integrating the tracking filter in the tunable LNA 204, the filter can be tuned directly in the signal path.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of tuning a receiver, the method comprising:
   providing a tunable Low Noise Amplifier (LNA) having an LNA and a filter which are selected during a calibration mode, wherein an input signal of the tunable LNA is passed to the selected filter through the selected LNA during a normal mode; and
   during the calibration mode, generating a local oscillation (LO) signal, generating a filter LO signal at an output of the tunable LNA by routing the LO signal to the selected filter, and tuning the selected filter according to the filter LO signal.

2. The method of claim 1, further comprising:
   isolating the selected filter from the selected LNA during the calibration mode; wherein the filter LO signal is generated by routing the LO signal to the selected filter which is isolated from the selected LNA.

3. The method of claim 2, further comprising:
   when isolating the selected filter from the selected LNA, shorting an input of the selected LNA to a predetermined voltage level.

4. The method of claim 3, wherein the step of shorting the input of the selected LNA to the predetermined voltage level comprises:
   coupling a switch unit between the selected LNA and the predetermined voltage level; and
   closing the switch unit during the calibration mode, wherein the switch unit is opened during the normal mode.

5. The method of claim 1, further comprising:
   shorting an input of the selected LNA to a predetermined voltage level during the calibration mode.

6. The method of claim 5, wherein the step of shorting the input of the selected LNA to the predetermined voltage level comprises:
   coupling a switch unit between the selected LNA and the predetermined voltage level; and
   closing the switch unit during the calibration mode, wherein the switch unit is opened during the normal mode.

7. The method of claim 1, wherein the step of tuning the selected filter according to the filtered LO signal comprises:
   determining a first signal power level of the filtered LO signal;
   adjusting the selected filter and correspondingly determining a second signal power level of the filtered LO signal; and
   determining whether or not to further adjust the selected filter by referring to the first signal power level and the second signal power level.

8. The method of claim 7, wherein the step of determining whether or not to further adjust the selected filter comprises:
   generating a comparison result by comparing the first signal power level to the second signal power level; and
   determining whether or not to further adjust the selected filter by referring to the comparison result.

9. The method of claim 8, wherein the step of determining whether or not to further adjust the selected filter by referring to the comparison result comprises:
   when the second signal power level is greater than the first signal power, continuing to adjust the selected filter.

10. The method of claim 7, wherein the selected filter has an LC load, and the selected filter is adjusted by changing a capacitance of the LC load.

11. The method of claim 1, wherein the tunable LNA comprises a plurality of LNAs and a plurality of filters respectively corresponding to the LNAs, and the method further comprises:
    determining the selected LNA from the plurality of LNAs and determining the selected filter from the plurality of filters according to a desired input signal frequency.

12. The method of claim 1, wherein the receiver is a direct conversion receiver.

13. The method of claim 12, wherein the direct conversion receiver is a digital direct conversion receiver.

* * * * *